US008773295B2

(12) United States Patent
Horio et al.

(10) Patent No.: US 8,773,295 B2
(45) Date of Patent: *Jul. 8, 2014

(54) DATA CONVERSION METHOD BASED ON SCALE-ADJUSTED B-MAP

(75) Inventors: Yoshihiko Horio, Warabi (JP); Kenya Jinno, Yokohama (JP); Tohru Kohda, Fukuoka (JP); Kazuyuki Aihara, Narashino (JP)

(73) Assignee: Japan Science and Technology Agency, Kawaguchi-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/638,140

(22) PCT Filed: Mar. 22, 2011

(86) PCT No.: PCT/JP2011/001664

§ 371 (c)(1),
(2), (4) Date: Sep. 28, 2012

(87) PCT Pub. No.: WO2011/125296

PCT Pub. Date: Oct. 13, 2011

(65) Prior Publication Data

US 2013/0015992 A1    Jan. 17, 2013

(30) Foreign Application Priority Data

Apr. 1, 2010  (JP) .................. 2010-085212

(51) Int. Cl.
*H03M 3/00* (2006.01)

(52) U.S. Cl.
USPC .......................................... 341/143; 341/155

(58) Field of Classification Search
USPC ................................ 341/143, 155
See application file for complete search history.

(56) References Cited

U.S. PATENT DOCUMENTS 6,452,524 B1 *  9/2002  Fraleigh et al. ............... 341/143
7,057,540 B2 *  6/2006  Muhammad et al. ......... 341/143

FOREIGN PATENT DOCUMENTS

WO   2009/014057 A1   1/2009
WO   2010/024196 A1   3/2010

OTHER PUBLICATIONS

Daubechies, Ingrid, et al, A/D Conversion With Imperfect Quantizers, IEEE Transactions on Information Theory, Mar. 2006, pp. 874-885, vol. 52, No. 3.
Daubechies, I., et al, Beta Expansions: A New Approach to Digitally Corrected A/D Conversion, Circuits and Systems, International Symposium, 2002, pp. II-784-II-787.
Hironaka, S., et al, Markov Chain of Binary Sequences Generated by A/D Conversion Using β-encoder, Proceedings of IEEE Workshop n Nonlinear Dynamics of Electronic Systems, 2007, pp. 261-264, Tokushima, Japan.
Hironaka, S. et al, Negative β-encoder, Proceedings of International Symposium on Nonlinear Theory and Its Applications, 2008, pp. 564-567, Budapest, Hungary.
Kohda, T., et al, Negative β-encoder, Journal of Class Files, Preprint, arXiv: 0808,2548v2[cs.IT], Jul. 28, 2009, http://arxiv.org/abs/0808.2548Jan. 2007, pp. 1-19.

\* cited by examiner

*Primary Examiner* — Khai M Nguyen
(74) *Attorney, Agent, or Firm* — Bacon & Thomas, PLLC

(57) ABSTRACT

There is provided a data conversion method based on β-map suited for an A/D converter or chaos generator, that is adapted to an integrated circuit and capable of providing stable operation of the circuit. The data conversion method based on scale-adjusted β-map includes a discrete time integrator 1 having an amplification coefficient $s(1-\beta)$ and a damping factor $\beta$, a quantizer 2 connected in series to the discrete time integrator 1, and a feedback circuit 3 connected from an output of the quantizer 2 to an input of the discrete time integrator 1.

10 Claims, 6 Drawing Sheets

DATA CONVERSION METHOD BASED ON SCALE-ADJUSTED β-MAP

BACKGROUND OF THE INVENTION

1. Field of the Invention

The present invention relates to a data conversion method based on scale-adjusted β-map, and particularly to an A/D converter and a chaos generator using a discrete time integrator for adapting to an integrated circuit.

2. Description of the Related Art

Conventionally, the data conversion method based on β-map has been proposed (see Non-Patent Document 1 listed below). This method is, as compared to the PCM (Pulse Code Modulation) method, superior in terms of stability as analog circuits. In other words, in the PCM method, the circuit operation potentially diverges due to the fluctuation or noises of circuit parameters, such as a threshold of a quantizer, a gain constant of a multiply-by-two amplifier. However, the convergence of conversion errors for bit lengths is exponential. On the other hand, in the ΣΔ-type converters, while the circuit operation is stable, the oversampling or the like is required to improve the conversion accuracy. In addition, they take more bit lengths for the convergence of conversion errors. In contrast, the data conversion method based on β-map is robust for mismatches of circuit parameters similar to the ΣΔ-type converters, while it provides the practically optimum rate-distortion characteristics similar to the PCM method.

In recent years, decoding algorithms have been disclosed for minimizing the errors using interval analysis, along with the design principles of circuit parameters, in order to further improve the performance of the data conversion method based on β-map (see Patent Documents 1 and 2, and Non-Patent Documents 2 to 4 listed below). Moreover, in order to enhance the degree of freedom of the circuit design, the data conversion method based on scale-adjusted β-map has been proposed that allows the gain β of an amplifier circuit and the threshold of a quantizer to be set up independently (see Patent Document 2, and Non-Patent Documents 3 and 4 listed below). In this regard, this method includes a conventional data converter based on β-map in certain cases.

In Patent Documents 1 and 2, and Non-Patent Documents 1 to 4 listed below, the block diagrams are presented to configure data encoders based on β-map (hereinbelow, A/D converters), the A/D converters based on scale-adjusted β-map, or the like. However, these block diagrams are not suitable for actual implementation of circuits, particularly integrated circuits.

Now, detailed description will be provided.

The scale-adjusted β-map S (•) is described in Equation (1) (see Patent Document 2, and Non-Patent Documents 3 and 4).

$$S(x) = \begin{cases} \beta x, & x \in [0, \gamma v) \\ \beta x - s(\beta - 1), & x \in [\gamma v, s) \end{cases} \quad (1)$$

wherein, $v \in [s(\beta-1), s)$ is a threshold parameter, $1 < \beta < 2$ is a conversion radix, and $\gamma = 1/\beta$, $s > 0$ is a scaling constant. In addition, when $s = (\beta-1)^{-1}$, the scale-adjusted β-map S (•) is the same as the β-map C(•) below (see Non-Patent Document 1).

$$C(x) = \begin{cases} \beta x, & x < \gamma v \\ \beta x - 1, & x \geq \gamma v \end{cases} \quad (2)$$

wherein, $v \in [1, (\beta-1)^{-1})$. Also, when $s = \beta \cdot (\beta-1)^{-1}$, the scale-adjusted β-map S (•) of Equation (1) above is the same as another β-map D(•) (see Non-Patent Document 1).

$$D(x) = \begin{cases} \beta x, & x < \gamma v \\ \beta(x-1), & x \geq \gamma v \end{cases} \quad (3)$$

wherein, $v \in [\beta, \beta(\beta-1)^{-1})$.

Assuming that the discrete time is $t_n$ (n is a natural number), and then by using it to rewrite Equation (1) above as the one-dimensional discrete time dynamical system, it can be described as $$x(t_{n+1}) = S(x(t_n)) = \begin{cases} \beta x(t_n), & x(t_n) \in [0, \gamma v) \\ \beta x(t_n) - s(\beta-1), & x(t_n) \in [\gamma v, s) \end{cases} \quad (4)$$

An example of the one-dimensional map is shown in FIG. 12. In this figure, $\beta = 5/3$, $s = 3$, $v = 5/2$, and $\gamma v = 3/2$. FIG. 12 also illustrates the trajectory with $x(t_1) = 0.6$ as an initial value. As shown in FIG. 12, the trajectory is resultantly confined within an invariant subinterval $[v-s(\beta-1), v)$ (the region D in FIG. 12).

Moreover, a binary variable $b(t_n) \in \{0,1\}$ is defined as $$b(t_n) = Q_\theta(x(t_n)) = \begin{cases} 0, & x(t_n) \in [0, \theta) \\ 1, & x(t_n) \in [\theta, s) \end{cases} \quad (5)$$

wherein, $Q_\theta(\cdot)$ is a quantizer with θ as the threshold. Also, the following applies hereinbelow.

$$\theta = \gamma v \quad (6)$$

At this time, Equation (4) above can be described as $$x(t_{n+1}) = \beta x(t_n) - b(t_n)s(\beta-1) \quad (7)$$

Here, assume that the input signal $x_{input}$ is sampled at $t = t_1$. That is, $$x(t_1) = x_{input} \quad (8)$$

At this time, by repeating Equation (7) above from $t = t_1$ to $t = t_L$ (L is a bit length after A/D conversion), the binary signal train $BS(x_{input})$ corresponding to the input signal $x_{input}$ is obtained.

$$BS(x_{input}) = (b_1 b_2 \ldots b_L)_{\beta,s} \quad (9)$$

wherein, $b_n = b(t_n)$ (n=1, 2, ..., L), $b_L = b(t_L)$ is the LSB (least significant bit), and $b_1 = b(t_1)$ is the MSB (most significant bit).

Here, the tolerance $\sigma_v$ of the threshold parameter $v$ of the quantizer $Q_\theta(\cdot)$ is given as follows with s and β (see Patent Document 2, and Non-Patent Documents 3 and 4).

$$\sigma_v = s(2-\beta) \quad (10)$$

This is shown in FIG. 12 as the bold line on the axis $x(t_{n+1})$. Accordingly, the threshold θ of the quantizer is allowed to vary within the range described as follows (see Patent Document 2, and Non-Patent Documents 3 and 4).

$$\sigma_\theta = \gamma \sigma_v = \gamma s(2-\beta) = s(2\gamma-1) \quad (11)$$

This is shown in FIG. 12 as the bold line on the axis $x(t_n)$.

The configuration diagrams of the A/D converter using the scale-adjusted β-map are shown in Patent Document 2, and Non-Patent Documents 3 and 4 listed below. FIG. 13 shows a configuration diagram of the A/D converter using the scale-adjusted β-map. However, the as-is configuration is not suitable for integrated circuits.

Patent Document 1: WO 2009/014057

Patent Document 2: WO 2010/024196

Non-Patent Document 1: I. Daubechies, R. A. DeVore, C. S. Gunturk, and V. A. Vaishampayan, "A/D conversion with imperfect quantizers", IEEE Transactions on Information Theory, Vol. 52, No. 3, pp. 874-885, 2006

Non-Patent Document 2: S. Hironaka, T. Kohda, and K. Aihara, "Markov chain of binary sequences generated by A/D conversion using β-encoder", in Proceedings of IEEE Workshop on Nonlinear Dynamics of Electronic Systems, pp. 261-264, Tokushima, Japan, 2007

Non-Patent Document 3: S. Hironaka, T. Kohda, and K. Aihara, "Negative β-encoder", in Proceedings of International Symposium on Nonlinear Theory and Its Applications, pp. 564-567, Budapest, Hungary, 2008

Non-Patent Document 4: T. Kohda, S. Hironaka, and K. Aihara, "Negative β-encoder", Preprint, arXiv: 0808.2548v2[cs.IT], 28 Jul. 2009, http://arxiv.org/abs/0808.2548

SUMMARY OF THE INVENTION

As described above, there has been a problem that the conventional A/D converters using the scale-adjusted β-map are not suitable for integrated circuits.

In addition, although the chaos generators using Bernoulli map or Tent map have been proposed as the circuits for generating chaos having uniform distribution of the invariant measure, these circuits have a disadvantage that, when the solution trajectory contacts the ends of a domain, it diverges due to non-ideal characteristics or noises of the circuit, resulting in the unstable operation.

In view of the circumstances described above, the present invention is directed to provide a data conversion method based on scale-adjusted β-map configured using a discrete time integrator, adapted to integrated circuits and suitable for chaos generators.

As a specific assembly, there is provided an A/D converter circuit based on scale-adjusted β-map using a switched capacitor (SC) circuit.

In addition, a chaos generator is proposed that is robust for mismatches or noises of circuit elements and operates stably without trajectory divergence, by extending the bit length of the above-mentioned A/D converter based on scale-adjusted β-map to the infinite because of the fact that the β-map is resultantly confined within an invariant subinterval having a finite trajectory. The proposed chaos generator easily allows realization of different chaos attractors readily only by changing circuit parameters.

Moreover, the specification checks the operations of the above-mentioned A/D converter circuit based on scale-adjusted β-map and the chaos generator applying thereof to explain their validity by the SPICE (Simulation Program with Integrated Circuit Emphasis) circuit simulation using ideal circuit elements.

In order to achieve the above-described objects, the present invention provides the following:

[1] A data conversion method based on scale-adjusted β-map including a discrete time integrator, a quantizer connected in series to the discrete time integrator, and a feedback circuit connected from an output of the quantizer to an input of the discrete time integrator.

[2] The data conversion method based on scale-adjusted β-map according to [1] above, wherein an A/D converter is configured of the discrete time integrator having an amplification coefficient $s(1-\beta)$ and a damping factor $\beta$, and the quantizer $Q_\theta(\cdot)$.

[3] The data conversion method based on scale-adjusted β-map according to [1] above, wherein an A/D converter is configured of the discrete time integrator having an amplification coefficient $1-\beta$ and a damping factor $\beta$, and the quantizer $\tilde{Q}_\theta^S(\cdot)$.

[4] The data conversion method based on scale-adjusted β-map according to [2] or [3] above, wherein the A/D converter is implemented using a switched capacitor integrator circuit.

[5] The data conversion method based on scale-adjusted β-map according to [2] or [3] above, wherein the A/D converter is configured as a chaos generator by extending a bit length L thereof to the infinite.

[6] The data conversion method based on scale-adjusted β-map according to any one of [1] to [5] above, wherein a chaotic time series having an initial value $x_{input}$ is obtained by operating an A/D converter based on scale-adjusted β-map $S(\cdot)$ to sample an input signal $x_{input}$ at discrete time $t_1$, and repeat the mapping L-times to obtain a conversion bit series $BS(x_{input})$ having the bit length L, and by extending the bit length to the infinite ($L=\infty$) in the operation.

[7] The data conversion method based on scale-adjusted β-map according to [6] above, wherein, if the initial value is not required to be set up, $-\infty<n<\infty$ at the discrete time $t_n$ is provided wherein the circuit subjected to sampling of the input signal is eliminated to configure a compact chaos generator.

Effect of the Invention

According to the present invention, the effects as follows can be provided.

(1) The A/D converter based on scale-adjusted β-map is configured using the discrete time integrator which is a core circuit element in the analog integrated circuit technology and used in most of the integrated circuits. Thus, the A/D converter of the present invention is suitable for circuit integration.

(2) The A/D converter employing the data conversion method based on scale-adjusted β-map is configured as the chaos generator. A solution trajectory of a scale-adjusted β-map is resultantly confined within a finite invariant subinterval, so that the chaos generator of the present invention is robust for non-ideal characteristics of the circuit elements or noises and operates stably.

DESCRIPTION OF THE PREFERRED EMBODIMENTS

Figure 1:
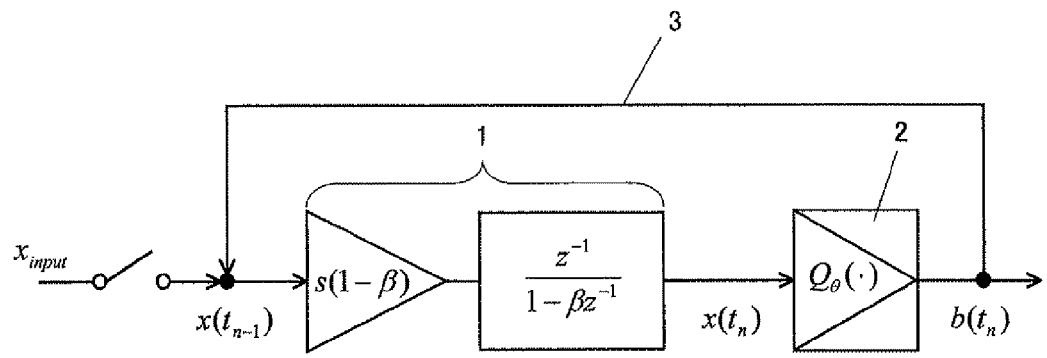
FIG. 1 is a configuration diagram of an A/D converter based on scale-adjusted β-map, illustrating a first embodiment of the present invention.

A data conversion method based on scale-adjusted β-map of the present invention includes a discrete time integrator, a quantizer connected in series to the discrete time integrator, and a feedback circuit connected from an output of the quantizer to an input of the discrete time integrator.

Embodiments

Hereinbelow, the embodiments of the present invention will be described in detail.

For a data conversion method based on scale-adjusted β-map of the present invention, an A/D converter based on scale-adjusted β-map configured using a discrete time integrator will be described.

The discrete time integrators are used mostly as a major component of an analog integrated circuit. The reasons include that the availability of circuit configuration that is less sensitive to non-ideal characteristics and mismatches of the elements, parasitic elements, or noises, and the ability to further improve the circuit performance with fully-differential circuits. In addition, switched capacitor (SC) circuits, switched current (SI) circuits, and the like are proposed as the integrated circuit technology for discrete time integrator circuits, and the vast knowledge about such circuits has been provided. The availability of such useful data is one of the reasons why the discrete time integrators are used. Therefore, there is proposed the data conversion method based on scale-adjusted β-map wherein the A/D converter using a scale-adjusted β-map is configured with the discrete time integrator.

First, Z conversion of Equation (7) above results in $$X(z) = \beta X(z)z^{-1} - B(z)z^{-1}s(\beta-1) \qquad (12)$$
$$= \beta X(z)z^{-1} - \beta s B(z)z^{-1} + sB(z)z^{-1}$$

wherein, X(z) and B(z) are variables of $x(t_n)$ and $b(t_n)$ in Z domain, respectively. Moreover, Equation (5) results in $$B(z) = Q_\theta(X(z)) \qquad (13)$$

and then, the following is obtained.

$$X(z) = \beta X(z)z^{-1} - \beta s Q_\theta(X(z))z^{-1} + s Q_\theta(X(z))z^{-1} \qquad (14)$$

Thereby, $$(1-\beta z^{-1})X(z) = s(1-\beta)Q_\theta(X(z))z^{-1} \qquad (15)$$

and resultantly, the following is obtained.

$$X(z) = s(1-\beta) \cdot \frac{z^{-1}}{1-\beta z^{-1}} \cdot Q_\theta(X(z)) \qquad (16)$$

FIG. 1 is a configuration diagram of an A/D converter based on scale-adjusted β-map, illustrating a first embodiment of the present invention.

In this figure, reference numeral 1 denotes a discrete time integrator, 2 denotes a quantizer connected in series to the discrete time integrator 1, and 3 denotes a feedback circuit connected from an output of the quantizer 2 to an input of the discrete time integrator 1.

As shown in FIG. 1, it is found that the A/D converter using the scale-adjusted β-map can be realized with the discrete time integrator 1 having an amplification coefficient s(1–β) and a damping factor β, and the quantizer 2 [$Q_\theta(\bullet)$]. However, an output bit series is given by Equation (9) above.

On the other hand, if the quantizer $Q_\theta^S(\bullet)$ that takes a binary $\{0,s\}$ as its output value is defined as $$Q_\theta^S(\bullet) \equiv s \times Q_\theta(\bullet) \qquad (17)$$

Equation (16) above can be rewritten as $$X(z) = (1-\beta) \cdot \frac{z^{-1}}{1-\beta z^{-1}} \cdot Q_\theta^S(X(z)) \qquad (18)$$

Figure 2:
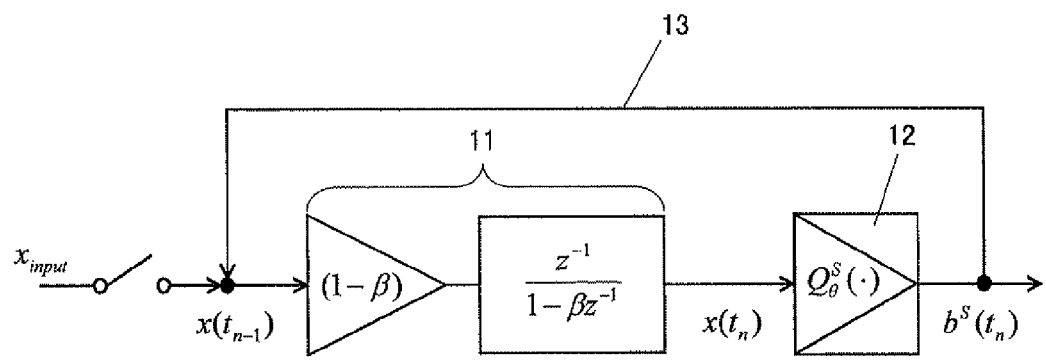
FIG. 2 is a configuration diagram of the A/D converter based on scale-adjusted β-map, illustrating a second embodiment of the present invention.

In this case, the A/D converter based on scale-adjusted β-map is configured as shown in FIG. 2.

FIG. 2 is a configuration diagram of the A/D converter based on scale-adjusted β-map, illustrating a second embodiment of the present invention.

In this figure, reference numeral 11 denotes a discrete time integrator, 12 denotes a quantizer connected in series to the discrete time integrator 11, and 13 denotes a feedback circuit connected from an output of the quantizer 12 to an input of the discrete time integrator 11.

As shown in FIG. 2, it is found that the A/D converter using the scale-adjusted β-map can be realized with the discrete time integrator 11 having an amplification coefficient 1–β and a damping factor β, and the quantizer 12 [$Q_\theta^S(\bullet)$]. In this case, an amplitude of an output bit series $b_n^S$ is $\{0,s\}$. That is, $$b_n^S = s \cdot b_n = b^S(t_n) = Q_\theta^S(x(t_n)) \qquad (19)$$

Next, a chaos generator employing the data conversion method based on scale-adjusted β-map will be described.

As described above, there has been a problem about the previously proposed chaos generators using Bernoulli map or Tent map that, when the solution trajectory contacts the ends of a domain, it diverges due to non-ideal characteristics or noises of the circuit, resulting in the unstable operation. Thus, the chaos generator that operates stably is proposed herein, utilizing the fact that the solution trajectory of a scale-adjusted β-map S (•) is resultantly confined within a finite invariant subinterval.

Figure 12:
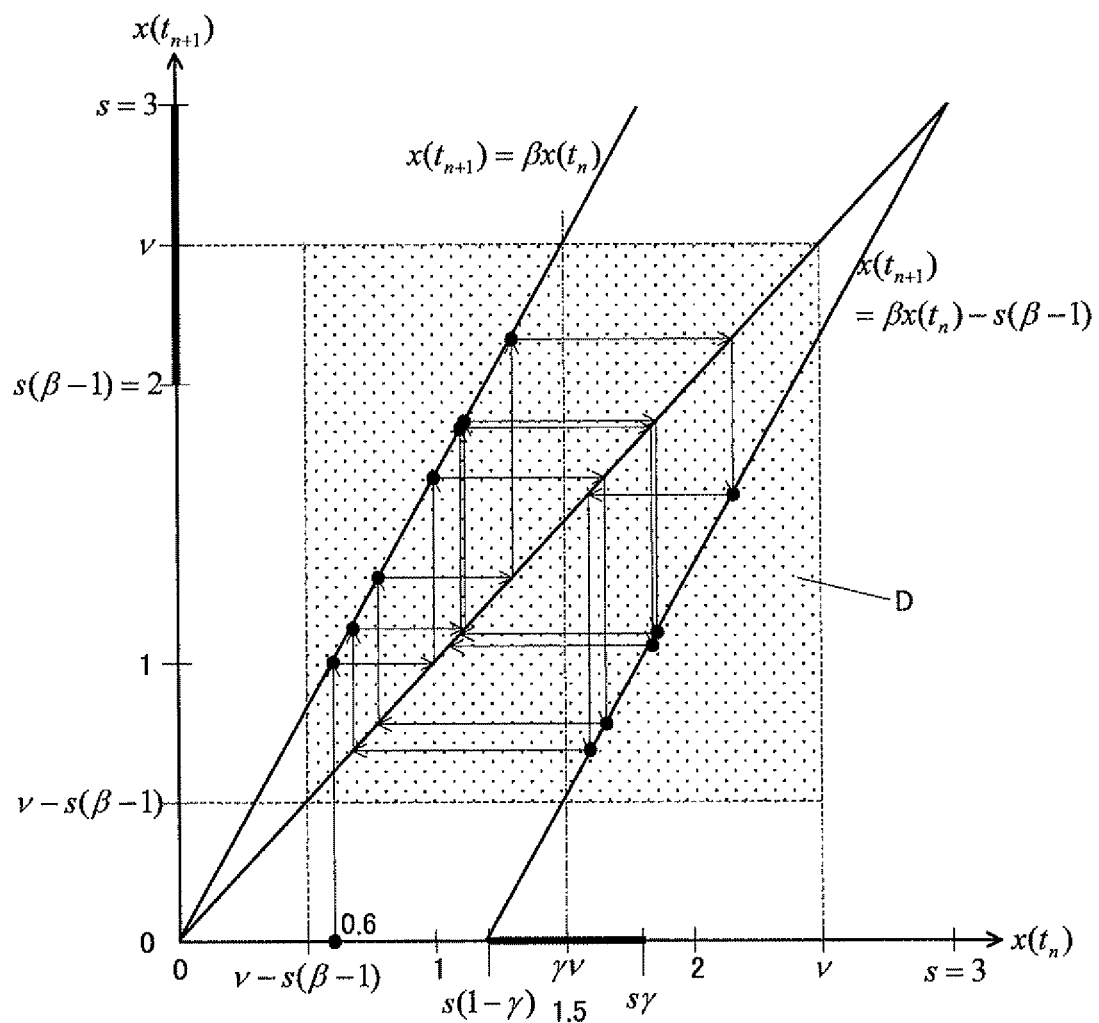
FIG. 12 shows an exemplary scale-adjusted β-map.

The solution trajectory of the scale-adjusted β-map S (•) is, after the transient status, trapped in an invariant subinterval [υ–s(β–1), υ) shown as D in FIG. 12. Thus, if that the width of trajectory shift due to non-ideal characteristics or noises of the circuit element is defined as $\delta_{deviation}$, the solution trajectory does not contact the ends (0 and s) of a domain $x(t_n)$ in a range of υ values of $s(\beta-1)+\delta_{deviation}<\upsilon<s-\delta_{deviation}$. As such, the solution trajectory does not diverge due to the effect of non-ideal characteristics or noises of the circuit, and the chaos generator operates stably. In addition, invariant measure is distributed uniformly in the invariant subinterval of a chaos trajectory realized by the β-map S (•), so that the resultant chaotic time series is considered to be readily applied to random number generation, encryption, and the like.

Next, a method of configuring the chaos generator with the scale-adjusted β-map S (•) will be described specifically. In the A/D converter based on scale-adjusted β-map S (•) described above, the operation of sampling the input signal $x_{input}$ at the discrete time $t_1$ and repeating the mapping L-times results in a conversion bit series $BS(x_{input})$ having a bit length of L. In this operation, extending the bit length to the infinite (L=∞) enables obtaining the chaotic time series having an initial value of $x_{input}$. Thereby, the A/D converter using the scale-adjusted β-map utilizing the discrete time integrator described above can be applied as is as the chaos generator. In addition, if the initial value is not required to be set up, $-\infty<n<\infty$ may be applied at the discrete time $t_n$. In this case, the A/D converter based on scale-adjusted β-map utilizing the discrete time integrator described above can eliminate the element for sampling the input signal, so that the more compact chaos generator can be realized.

Next, as an embodiment of the present invention, an exemplary circuit of the A/D converter based on scale-adjusted β-map utilizing the switched capacitor (SC) will be described.

The major technology of discrete time analog circuits (sampled data circuits) includes the SC circuits and the SI (switched current) circuits. Here, a method will be described to realize the A/D converter circuit based on scale-adjusted β-map utilizing the SC circuit. In this regard, note that the circuit can also be realized in a similar manner using the SI circuit. Specifically, the method will be described to implement the A/D converter circuit using the scale-adjusted β-map given in Equation (16) and FIG. 1 or Equation (18) and FIG. 2, utilizing an SC integrator circuit.

[1] Circuit example 1 utilizing SC circuit: the case using Equation (16) and FIG. 1

Figure 3:
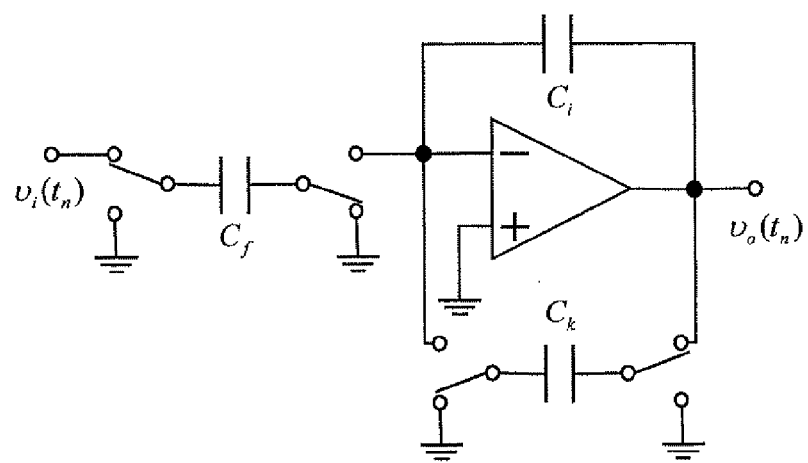
FIG. 3 shows a typical switched capacitor integrator circuit.

FIG. 3 shows a typical switched capacitor (SC) integrator circuit. The transfer function in the Z domain of this circuit is given by:

$$V_o(z) = \frac{C_f}{C_i} \cdot \frac{z^{-1}}{1-\left(1+\frac{C_k}{C_i}\right)z^{-1}} \cdot V_i(z) \quad (20)$$

Where, $V_o(z)$ and $V_i(z)$ are variables of $\upsilon_o(t_n)$ and $\upsilon_i(t_n)$ in the Z domain, respectively. It is found that, by comparing Equations (16) and (20), $$V_o(z)=X(z) \quad (21)$$

$$C_f/C_i=s(1-\beta) \quad (22)$$

$$C_k/C_i=\beta-1 \quad (23)$$

$$V_i(z)=Q_\theta(X(z)) \quad (24)$$

may be applied. However, since $-1<1-\beta<0$ is derived from $1<\beta<2$ and thus the capacitor ratio becomes negative in Equation (22) above, it is physically infeasible.

Thus, the quantizer $$\tilde{Q}_\theta(\cdot) \equiv -Q_\theta(\cdot) \quad (25)$$

having a negative sign on the output is introduced. Using this, Equation (16) above can be transformed as $$X(z) = s(\beta-1) \cdot \frac{z^{-1}}{1-\beta z^{-1}} \cdot \tilde{Q}_\theta(X(z)) \quad (26)$$

As the result, if the conditions $$V_o(z)=X(z) \quad (27)$$

$$C_f/C_i=s(\beta-1) \quad (28)$$

$$C_k/C_i=\beta-1 \quad (29)$$

$$V_i(z)=\tilde{Q}_\theta(X(z)) \quad (30)$$

are satisfied in the circuit shown in FIG. 3, the A/D converter based on scale-adjusted β-map can be realized from the circuit in FIG. 3 and the quantizer $\tilde{Q}_\theta(\cdot)$.

Figure 4:
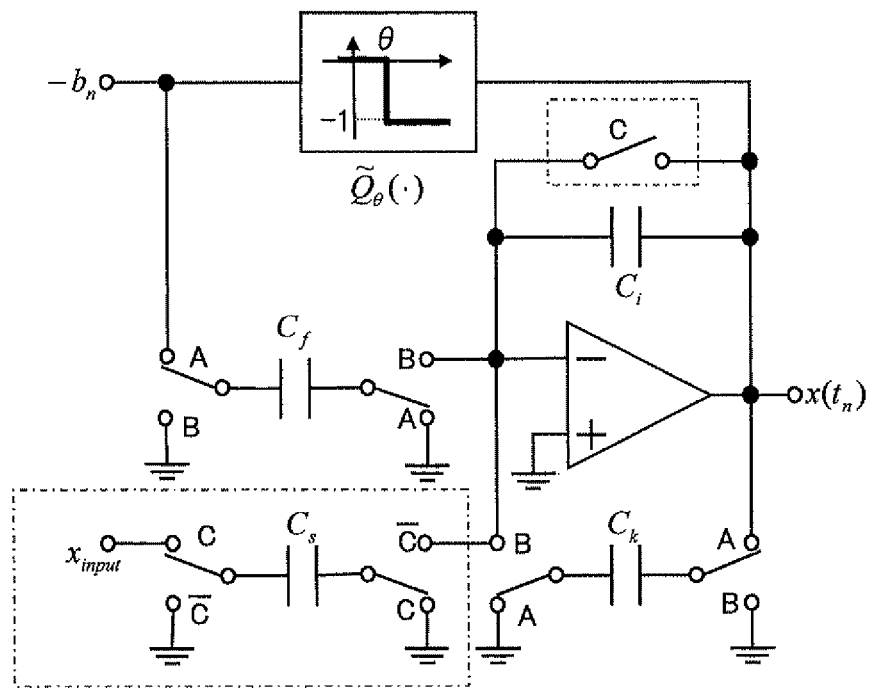
FIG. 4 is a configuration diagram of a first A/D converter based on scale-adjusted β-map using the switched capacitor integrator circuit of the present invention.

In this regard, since the circuit in FIG. 3 does not include a circuit to input the input signal $x_{input}$, there is a need to add a circuit in FIG. 3 to sample the input signal. FIG. 4 shows a circuit with such an additional circuit, along with the quantizer $\tilde{Q}_\theta(\cdot)$ inserted into the feedback path.

FIG. 4 is a configuration diagram of a first A/D converter based on scale-adjusted β-map using a switched capacitor integrator circuit of the present invention.

FIG. 4 shows the SC circuit that realizes the A/D converter based on scale-adjusted β-map as represented in Equation (16) and FIG. 1. Here, the regions enclosed by the alternate long and short dash lines may be eliminated when applying to the chaos circuit that does hot require the set-up of the initial value.

Figure 5:
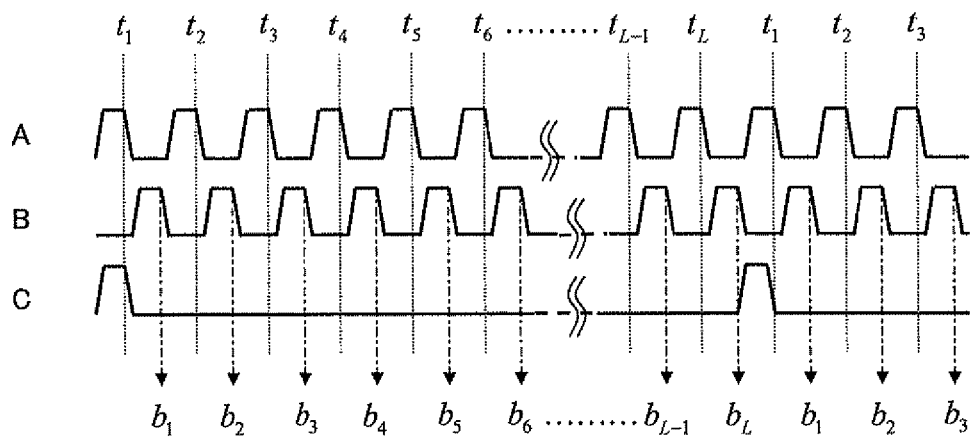
FIG. 5 is a waveform diagram of a three-phase clock to drive a circuit according to the present invention.

Moreover, FIG. 5 shows clocks φA and φB to drive the circuit, as well as a clock φC to simultaneously sample the input signal and reset initial charge of $C_i$.

FIG. 5 shows a waveform of the three-phase clock to drive the SC circuit in FIGS. 4, 6, 7, and 8. In this figure, L denotes a bit length, and the output bit series $b_n$ is sampled at the rising of φB, i.e. $t_{n+1/2}$.

Here, if the input signal is sampled according to Equation (8) above, a most significant bit $b_1$ is $$b_1=b(t_1)=Q_\theta(x(t_1))=Q_\theta(x_{input}) \quad (31)$$

On the other hand, when the input signal is sampled at $t_1$ as shown in FIG. 5 and $b_1$ is output at $t_{1+1/2}$ in the circuit in FIG. 4, the transfer function of the circuit in that case is $$-b_1 = -b(t_{1+1/2}) = \tilde{Q}_\theta\left(\frac{C_s}{C_i} \cdot x_{input}\right) \quad (32)$$

By comparing Equations (31) and (32) above, it can be found that, if the input signal is sampled according to Equation (8) above in the circuit in FIG. 4, $$C_s/C_i=1 \quad (33)$$

may be applied. In this case, in order to obtain a decoded value $\hat{x}_L$ of an original signal from the output bit series of L-bits, $$\hat{x}_L = s(\beta - 1)\sum_{i=1}^{L} b_i \gamma^i + \frac{s\gamma^L}{2} \quad (34)$$

may be applied (see Patent Document 2 and Non-Patent Documents 3 and 4). However, it should be noted that the bit series obtained from FIG. 4 is $-b_n$.

Figure 13:
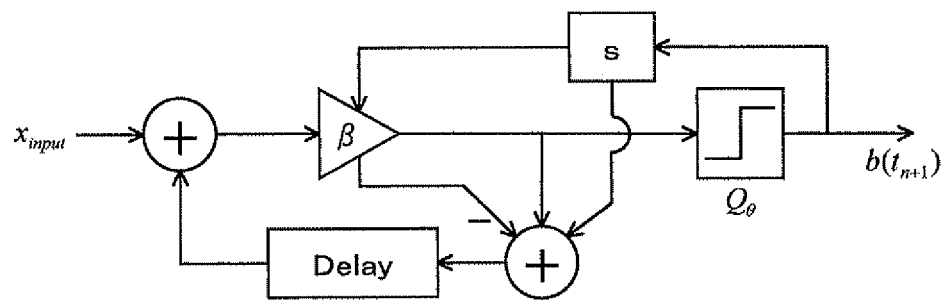
FIG. 13 is a configuration diagram of a conventional A/D converter based on scale-adjusted β-map.

Meanwhile, as shown in FIG. 13, when sampling the input signal as $$x(t_1) = \beta x_{input} \quad (35)$$

the following may be applied.

$$C_s/C_i = \beta \quad (36)$$

In this case, in order to obtain the decoded value $\hat{x}_L$ of the original signal from the output bit series of L-bits, $$\hat{x}_L = s(1-\gamma)\sum_{i=1}^{L} b_i \gamma^i + \frac{s\gamma^{L+1}}{2} \quad (37)$$

may be applied considering that the input signal $x_{input}$ is initially multiplied by $\beta$. However, it should also be noted that the bit series obtained from the circuit shown in FIG. 4 is $-b_n$.

Hereinbefore, it has been illustrated that the A/D converter based on scale-adjusted $\beta$-map represented in Equation (16) and FIG. 1 can be realized using the SC circuit shown in FIG. 4. Next, the circuit configuration will be described in the case where s has a certain value.

(a) Example where $s=(\beta-1)^{-1}$

In this case, the scale-adjusted $\beta$-map S (•) would be the $\beta$-map C(•) given by Equation (2) above. In FIG. 4, Equation (28) gives $$C_f/C_i = (\beta-1)^{-1} \times (\beta-1) = 1 \quad (38)$$

Figure 6:
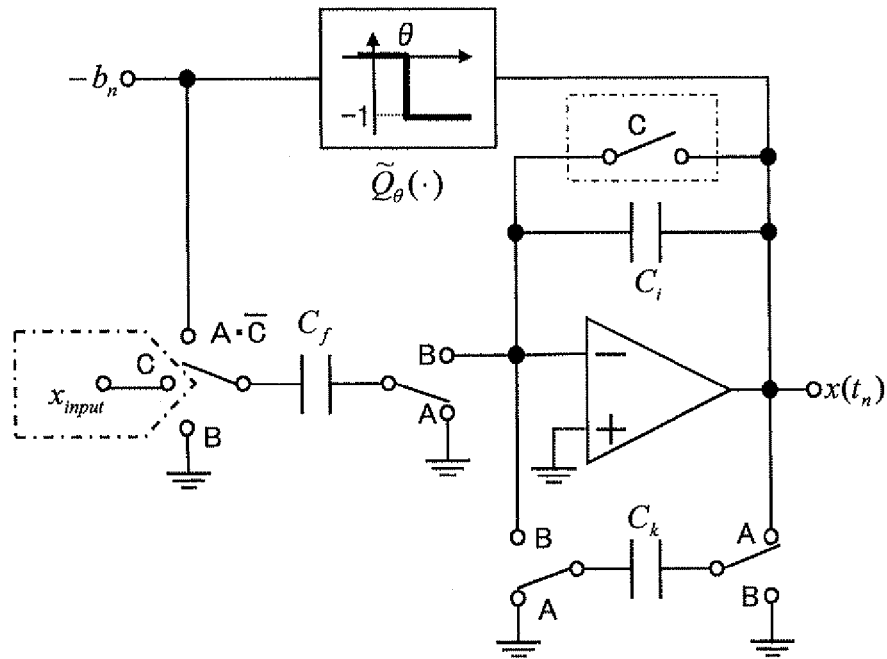
FIG. 6 is a circuit diagram illustrating the cases where $s=(1-\beta)^{-1}$ ($C_f=C_s=C_i$) and $s=\beta(1-\beta)^{-1}$ ($C_f=C_s=\beta C_i$) in FIG. 4.

In this case, $C_k$ and $C_s$ may be given by Equations (29) and (33) above, respectively. This results in $$C_f/C_i = C_s/C_i = 1 \quad (39)$$

so that $C_f$ and $C_s$ can be shared in the circuit in FIG. 4. Thus, the circuit can be simplified as shown in FIG. 6. FIG. 6 shows a circuit in the cases where $s=(1-\beta)^{-1}$ ($C_f=C_s=C_i$) and $s=\beta(1-\beta)^{-1}$ ($C_f=C_s=\beta C_i$) (described below) in FIG. 4. Although the clock waveform is the same as that shown in FIG. 5, it is required to combine $\phi A \cdot \overline{\phi C}$. Here, the regions enclosed by the alternate long and short dash lines may be eliminated when applying to the chaos generator that does not require the set-up of the initial value. Also, in this regard, the clock of $\phi A \cdot \overline{\phi C}$ may simply utilize $\phi A$.

(b) Example where $s=\beta(\beta-1)^{-1}$

In this case, the scale-adjusted $\beta$-map S (•) would be the $\beta$-map D(•) given by Equation (3) above. In FIG. 4, Equation (28) gives $$C_f/C_i = \beta(\beta-1)^{-1} \times (\beta-1) = \beta \quad (40)$$

In this case, $C_k$ and $C_s$ may be given by Equations (29) and (33) above, respectively.

Although this still does not make it possible to simplify FIG. 4, $C_s$ is given by Equation (36) above if the input is sampled as described by Equation (35) above, so that $C_f$ and $C_s$ can be shared in the circuit in FIG. 4 as with Example (a) described above. Accordingly, the simplified circuit as shown in FIG. 6 can also be used. However, $$C_f/C_i = C_s/C_i = \beta \quad (41)$$

Moreover, it is required to use Equation (37) above for the decoding.

[2] Circuit example 2 utilizing SC circuit: the case using Equation (18) above and FIG. 2

In the method described above in Section [1], the value of $C_f$ is a function of s and $\beta$, introducing the constraint on the degree of freedom of the circuit design. Therefore, in order to enhance the degree of freedom of the circuit design, the method of circuit configuration is proposed here, wherein the circuit parameter only depends on either s or $\beta$.

It is found from the comparison between the transfer function of the SC integrator circuit in FIG. 3 [Equation (20)] and Equation (18) that, if $$V_o(z) = X(z) \quad (42)$$

$$C_f/C_i = 1-\beta \quad (43)$$

$$C_k/C_i = \beta-1 \quad (44)$$

$$V_i(z) = Q_\theta^S(X(z)) \quad (45)$$

are applied, the A/D converter using the scale-adjusted $\beta$-map can be realized utilizing the circuit in FIG. 3. However, as described above in Section [1], $$C_f/C_i = 1-\beta < 0 \quad (46)$$

and the negative capacitor ratio is physically infeasible. As such, as with Section [1] above, the quantizer $$\tilde{Q}_\theta^S(\bullet) \equiv -Q_\theta^S(\bullet) \quad (47)$$

having a negative sign on the output is introduced. Using this, Equation (18) above can be transformed as $$X(z) = (\beta-1) \cdot \frac{z^{-1}}{1-\beta z^{-1}} \cdot \tilde{Q}_\theta^S(X(z)) \quad (48)$$

Figure 7:
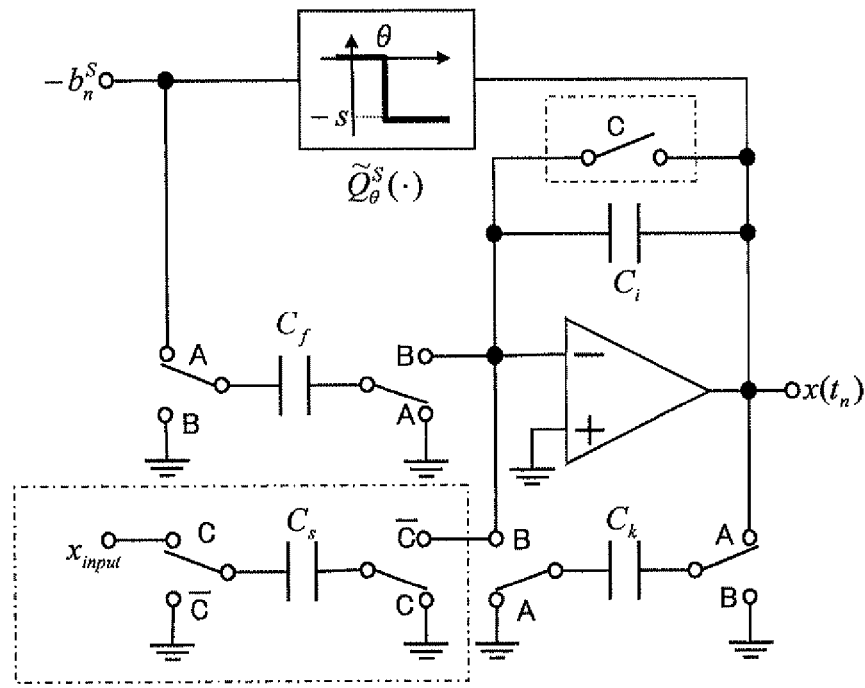
FIG. 7 is a configuration diagram of a second A/D converter based on scale-adjusted β-map using the switched capacitor integrator circuit of the present invention.

As a result, if the conditions $$V_o(z) = X(z) \quad (49)$$

$$C_f/C_i = \beta-1 \quad (50)$$

$$C_k/C_i = \beta-1 \quad (51)$$

$$V_i(z) = \tilde{Q}_\theta^S(X(z)) \quad (52)$$

are satisfied in the circuit shown in FIG. 7, the A/D converter based on scale-adjusted $\beta$-map can be realized on the basis of the circuit shown in FIG. 3.

FIG. 7 is a configuration diagram of a second A/D converter based on scale-adjusted $\beta$-map using the switched capacitor integrator circuit of the present invention. This figure shows the SC circuit that realizes the A/D converter based on scale-adjusted $\beta$-map as represented in Equation (18) and FIG. 2. Here, the regions enclosed by the alternate long and short dash lines may be eliminated when applying to the chaos generator that does not require the set-up of the initial value.

As with Section [1] described above, FIG. 7 shows the circuit in FIG. 3 including an additional circuit to sample the input signal and the quantizer $\tilde{Q}_\theta^S(\bullet)$. That is, such a circuit allows realization of the A/D converter based on scale-adjusted $\beta$-map using the SC circuit. Here, the clock waveform to drive this circuit is the same as that of the circuits in FIGS. 4 and 6, and is shown in FIG. 5.

Here, if the input signal is sampled according to Equation (8) above, the most significant bit $b_1^S$ is $$b_1^S = b^S(t_1) = Q_\theta^S(x(t_1)) = Q_\theta^S(x_{input}) \qquad (53)$$

On the other hand, if the input signal of the circuit in FIG. 7 is sampled at $t_1$ as shown in FIG. 5 and $-b_1^S$ is output at $t_{1+1/2}$, the transfer function of the circuit at the time is $$-b_1^S = -b^S(t_{1+1/2}) = \tilde{Q}_\theta^S\left(\frac{C_s}{C_I} \cdot x_{input}\right) \qquad (54)$$

Therefore, in comparison between Equations (53) and (54) above, it is found that $C_s$ may be determined in the circuit in FIG. 7 as described in Equation (33). In this case, in order to obtain the decoded value $\hat{x}_L^S$ of the original signal from the output bit series of L-bits, Equation (34) above may be used. Here, it should be noted that the bit series to be output would be $-b_n^S = -s \cdot b_n$.

On the other hand, as shown in FIG. 13, when sampling the input signal according to Equation (35) above, $C_s$ may be determined as described in Equation (36) above. In this case, Equation (37) above is used to obtain the decoded value $\hat{x}_L^S$ of the original signal from the output bit series of L-bits.

Meanwhile, the additional quantizer $\tilde{Q}_\theta^S(\bullet)$ is introduced in the circuit shown in FIG. 7. However, by changing the switch control on the left side of $C_f$ in FIG. 4 to be controlled by the output of the quantizer and introducing a DC voltage source of $-s$ V, the circuit equivalent to that in FIG. 7 can be realized. Such a circuit is shown in FIG. 8.

Figure 8:
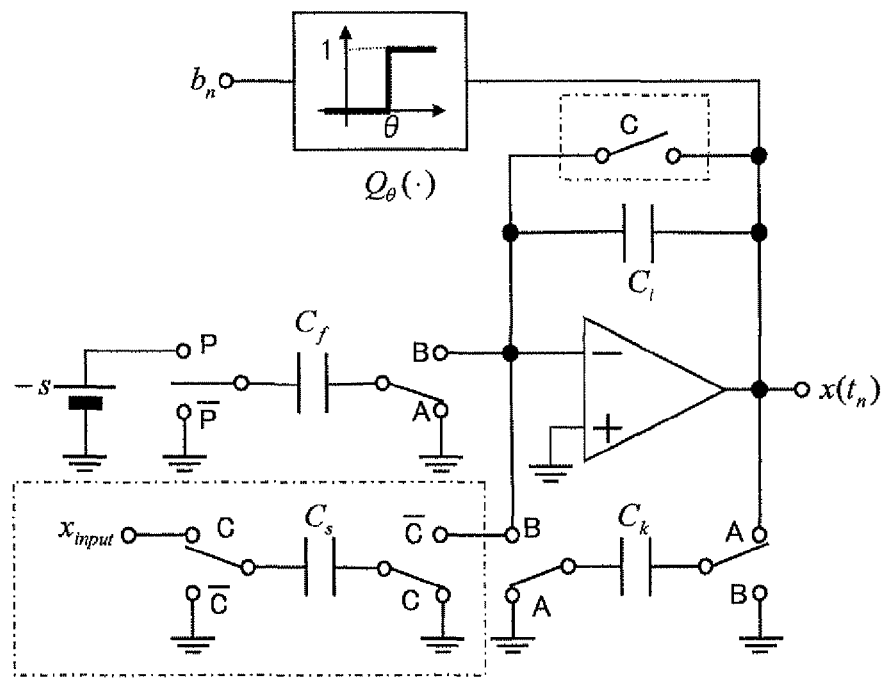
FIG. 8 is a configuration diagram of a third A/D converter based on scale-adjusted β-map using the switched capacitor integrator circuit of the present invention.

FIG. 8 is a configuration diagram of a third A/D converter based on scale-adjusted β-map using the switched capacitor integrator circuit of the present invention, illustrating another method of the SC circuit that realizes the A/D converter based on scale-adjusted β-map represented in Equation (18) above and FIG. 2. In the circuit in FIG. 8, the quantizer $Q_\theta(\bullet)$ is used, which output controls an input switch of the switched capacitor $C_i$. A control signal P thereof is $P = b_n \cdot \phi A$, and the output bit series is $b_n$ having no negative sign.

On the other hand, the circuit shown in FIG. 8 would be equivalent to that in FIG. 4 by setting the voltage of the DC voltage source to $-1$ V. That is, the circuit shown in FIG. 8 serves as well to realize the circuit described in Section [1] above. In this regard, it is also characterized in that the output bit series has no negative sign. Here, the regions enclosed in the alternate long and short dash lines are eliminated when applying to the chaos generator that does not require the set-up of the initial value.

All of the A/D converters based on scale-adjusted β-map proposed above can be used as is as the chaos generators by extending the bit length L to the infinite. That is, the interval of $\phi C$ in FIG. 5 may be extended to $\infty$ (here, $\phi C$ is a single pulse).

Furthermore, if the initial value of the chaotic time series is not required to be set up, the circuit to sample the input signal (as enclosed in the alternate long and short dash lines in each figure), as well as the clock $\phi C$, may be eliminated from the circuits shown in FIGS. 4, 6, and 8.

Next, the SPICE simulation using ideal circuit elements is conducted in order to check the validity of the A/D converter circuit based on scale-adjusted β-map of the present invention. Here, the circuit shown in FIG. 8 becomes equivalent to the circuits shown in FIGS. 4, 6, and 7 by adjusting the circuit parameters, so that the simulation was conducted using the circuit in FIG. 8. In addition, although the value of β is usually estimated from the bit series after conversion (see Patent Documents 1 and 2, and Non-Patent Documents 1 to 4), the value of β was assumed to be known because the object here is to check the operation in an ideal condition. Here, note that $\beta = 5/3$, $s = 3$ in the following simulation.

First, the bit series $BS(x_{input})$ output from the circuit is verified whether it coincides with the theoretical value. Table 1 shows the comparison of the A/D-converted output bit series for the input signal $x_{input}$, obtained from the SPICE simulation of the circuit in FIG. 8 and from the theoretical equation. Here, the bit length $L = 8$. From the table, it can be found that the circuit of the present invention performs the A/D conversion based on scale-adjusted β-map correctly.

TABLE 1

| | Quantization | Output bit series BS ($x_{input}$) | | |
|---|---|---|---|---|
| Input $x_{input}$ | threshold θ | SPICE | Theoretical value | Error |
| 0.1 | 1.21 | 00001000 | 00001000 | 0 |
| | 1.5 | 00000110 | 00000110 | 0 |
| | 1.79 | 00000101 | 00000101 | 0 |
| 0.5 | 1.21 | 01000100 | 01000100 | 0 |
| | 1.5 | 00110101 | 00110101 | 0 |
| | 1.79 | 00110100 | 00110100 | 0 |
| 0.95 | 1.21 | 10010100 | 10010100 | 0 |
| | 1.5 | 10010100 | 10010100 | 0 |
| | 1.79 | 01110101 | 01110101 | 0 |

Next, the evaluation is conducted of the conversion error of the decoded value of the output bit series obtained from the SPICE simulation of the circuit shown in FIG. 8. When the conversion bit length is L, the upper bound of the quantization error is given by $$\varepsilon_L(x) = |x_{input} - \hat{x}_L| \le \frac{s\gamma^L}{2} \qquad (55)$$

Using this, the bit length $L = 13$ is adopted to provide $\varepsilon_L(x) \le 2^{-9}$.

Figure 9:
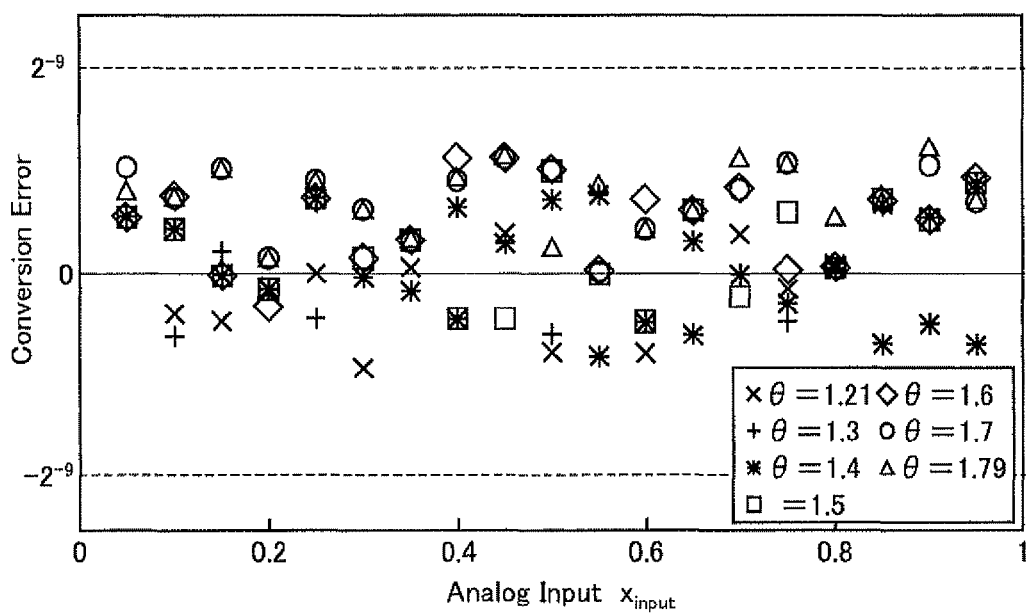
FIG. 9 shows conversion errors for different quantization thresholds θ when input signals $x_{input}$ are swept in the circuit in FIG. 8.
Figure 10:
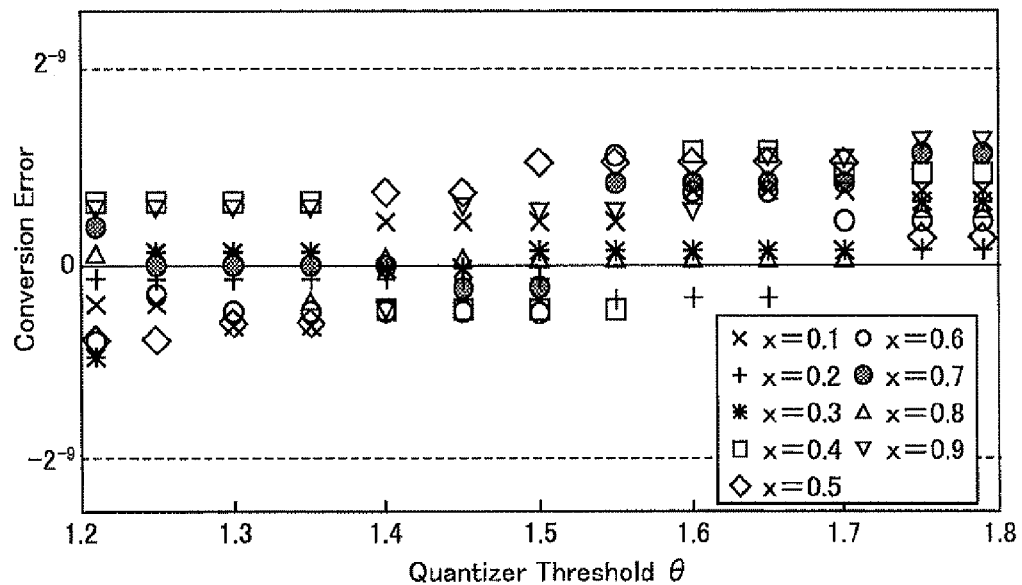
FIG. 10 shows conversion errors for different input signals $x_{input}$ when quantization thresholds θ are swept in the circuit in FIG. 8.

FIG. 9 shows results of evaluation of the conversion errors for different quantization thresholds θ in each input signal $x_{input}$. FIG. 10 shows results of the conversion errors obtained for different input signals $x_{input}$ while θ is varied. From these results, it was verified that, in the circuit of the present invention, the input signals $x_{input}$ are A/D converted correctly with greater conversion accuracy than the set-up while the quantization threshold θ is varied. In other words, it was verified that the circuit of the present invention has the robustness for variation in θ, which is the characteristic of the A/D conversion based on scale-adjusted β-map.

Figure 11:
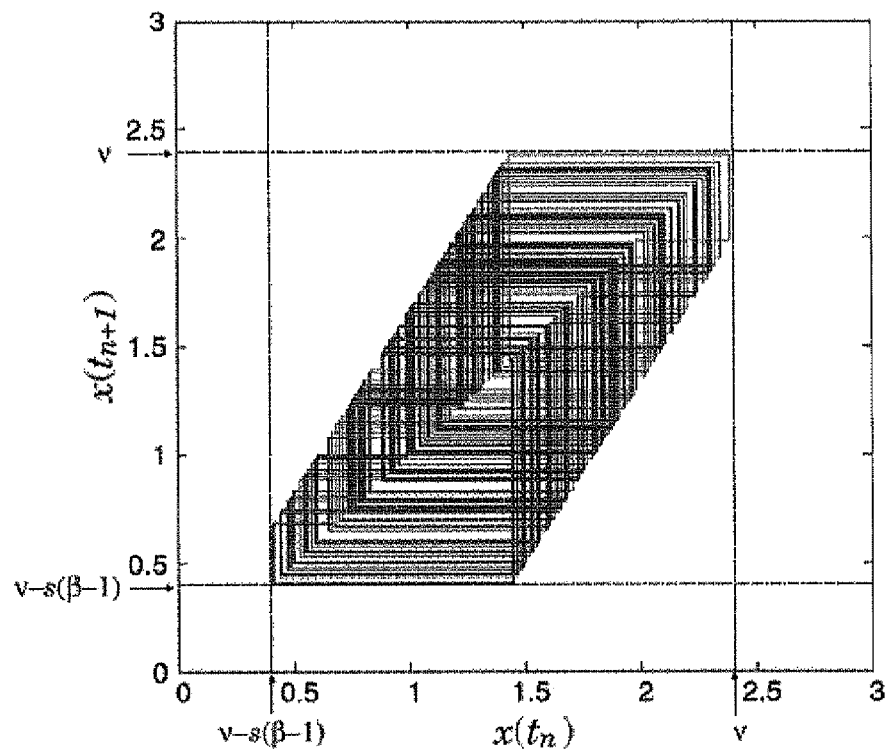
FIG. 11 shows an exemplary chaos attractor obtained from the SPICE simulation of the circuit in FIG. 8.

Furthermore, in the circuit shown in FIG. 8, the chaos generator was realized with the bit length $L = \infty$. FIG. 11 shows an exemplary chaos attractor obtained from the SPICE simulation when $\theta = 1.44$. From FIG. 11, it is found that the chaos attractor remains within the invariant subinterval $(\upsilon - s(\beta - 1) = 0.4 \le x(t_n) \le \upsilon = 2.4)$.

As described above, the present invention has been proposed the method of realizing the A/D converter that utilizes the data conversion method based on scale-adjusted β-map using the discrete time integrator. The discrete time integrator is a core circuit element of the analog integrated circuit technology and is used in most cases in the integrated circuits. Accordingly, the A/D converter circuit based on scale-adjusted β-map of the present invention is considered to be suitable for circuit integration. Herein, some of specific circuits have also been realized using the switched capacitor circuits as examples.

Moreover, there has been proposed herein to configure the A/D converter that utilizes the data conversion method based on scale-adjusted β-map as the chaos generator. Since the solution trajectory of the scale-adjusted β-map is resultantly confined within the finite invariant subinterval, the chaos generator according to the present invention provides the robustness for non-ideal characteristics or noises of the circuit elements along with the stable operation.

Finally, with the SPICE circuit simulation using the ideal circuit elements, the checking has been conducted on the operation of the A/D converter circuit that utilizes the data conversion method based on scale-adjusted β-map of the present invention to verify its validity.

The A/D converter based on scale-adjusted β-map of the present invention provides the robustness for the change in the circuit characteristics due to the non-ideal characteristics or the like of the circuit elements and noises, so that it can contribute to the realization of compact, low-power-consuming, inexpensive, and highly-efficient A/D converter circuits or chaos generators, in particular to the circuit integration thereof. In addition, in terms of circuit integration, the A/D convertor circuits or chaos generators based on scale-adjusted β-map of the present invention are suitable even for the semiconductor process on the order of sub-microns or below that is not suited for the integration of analog circuits due to their poor quality of matching or element characteristics of the circuit elements. Moreover, the A/D convertor circuits based on scale-adjusted β-map of the present invention are applicable to a wide variety of circuits and systems, including various circuits used in systems that operate in the significantly changing environment, such as circuits for large-scale sensor networks, sensor node circuits for sensor dust, node circuits for emergency communications in large-scale disasters, various circuits utilized in the outer space, vehicle-mounted circuits, circuits for mobile robotics, circuits for wireless communication terminals, and the like. Furthermore, the chaos generators applying the A/D converter are widely available in the field of cryptology, chaos communications, random number generation, or chaos information processing.

The present invention should not be limited to the embodiments described above, and a number of variations are possible on the basis of the spirit of the present invention. These variations should not be excluded from the scope of the present invention.

Industrial Applicability

The data conversion method based on scale-adjusted β-map of the present invention provides the robustness for the change in environment or circuit characteristics, and contributes to the realization of compact, low-power-consuming, inexpensive, and highly-efficient A/D converter circuits or chaos generators.

What is claimed is:

1. A circuit for an A/D converter for a data conversion method based on scale-adjusted β-map comprising:
   a discrete time integrator;
   a quantizer $Q_\theta(\cdot)$ connected in series to the discrete time integrator; and
   a feedback circuit connected from an output of the quantizer $Q_\theta(\cdot)$ to an input of the discrete time integrator,
   wherein the A/D converter is configured to convert data using a scale-adjusted β-map wherein the discrete time integrator has an amplification coefficient $s(1 - \beta)$ and a damping factor $\beta$.

2. The circuit for an A/D converter for a data conversion method based on scale-adjusted β-map according to claim 1, wherein the A/D converter is implemented using a switched capacitor integrator circuit.

3. The circuit for an A/D converter for a data conversion method based on scale-adjusted β-map according to claim 1, wherein the A/D converter is configured as a chaos generator by extending a bit length L thereof to the infinite.

4. The circuit for an A/D converter for a data conversion method based on scale-adjusted β-map according to claim 1, wherein a chaotic time series having an initial value $X_{input}$ is obtained by operating an A/D converter based on scale-adjusted β-map S (•) to sample an input signal $X_{input}$ at discrete time $t_1$, and repeats the mapping L-times to obtain a conversion bit series BS ($X_{input}$) having the bit length L, and by extending the bit length to the infinite (L=∞) in the operation.

5. The circuit for an A/D converter for a data conversion method based on scale-adjusted β-map according to claim 4, wherein, if the initial value is not required to be set up, $-\infty < n < \infty$ at the discrete time $t_n$ is provided wherein the circuit subjected to sampling of the input signal is eliminated to configure a compact chaos generator.

6. A circuit for an A/D converter for a data conversion method based on scale-adjusted β-map comprising:
   a discrete time integrator;
   a quantizer $\tilde{Q}_\theta^S(\cdot)$ connected in series to the discrete time integrator; and
   a feedback circuit connected from an output of the quantizer $\tilde{Q}_\theta^S(\cdot)$ to an input of the discrete time integrator,
   wherein the A/D converter is configured to convert data using a scale-adjusted β-map wherein the discrete time integrator has an amplification coefficient $1-\theta$ and a damping factor $\beta$.

7. The circuit for an A/D converter for a data conversion method based on scale-adjusted β-map according to claim 6, wherein the A/D converter is implemented using a switched capacitor integrator circuit.

8. The circuit for an A/D converter for a data conversion method based on scale-adjusted β-map according to claim 6, wherein the A/D converter is configured as a chaos generator by extending a bit length L thereof to the infinite.

9. The circuit for an A/D converter for a data conversion method based on scale-adjusted β-map according to claim 6, wherein a chaotic time series having an initial value $X_{input}$ is obtained by operating an A/D converter based on scale-adjusted β-map S (•) to sample an input signal $X_{input}$ at discrete time $t_1$, and repeats the mapping L-times to obtain a conversion bit series BS ($X_{input}$) having the bit length L, and by extending the bit length to the infinite (L=∞) in the operation.

10. The circuit for an A/D converter for a data conversion method based on scale-adjusted β-map according to claim 9, wherein, if the initial value is not required to be set up, $-\infty < n < \infty$ at the discrete time $t_n$, is provided wherein the circuit subjected to sampling of the input signal is eliminated to configure a compact chaos generator.

* * * * *